United States Patent [19]

Braband et al.

[11] Patent Number: 4,477,901
[45] Date of Patent: Oct. 16, 1984

[54] DIRECTIVE DIAGNOSTICS

[75] Inventors: Edward C. Braband, Penfield; Frank R. Walsh, Webster, both of N.Y.

[73] Assignee: Xerox Corporation, Stamford, Conn.

[21] Appl. No.: 323,783

[22] Filed: Nov. 23, 1981

[51] Int. Cl.³ ............................................. G06F 11/22
[52] U.S. Cl. ........................................ 371/15; 371/20; 364/900
[58] Field of Search ..................... 371/20, 15, 19, 60; 364/900, 200; 377/13, 15, 16; 355/14 E, 14 R

[56] References Cited

U.S. PATENT DOCUMENTS

| | | | |
|---|---|---|---|
| 3,344,408 | 3/1965 | Singer et al. | 377/15 |
| 3,832,531 | 8/1974 | Neill et al. | 377/15 |
| 4,104,726 | 8/1978 | Fisk et al. | 371/20 |
| 4,133,477 | 1/1979 | Marino et al. | 371/20 |
| 4,162,396 | 7/1979 | Howard et al. | 371/29 |
| 4,206,346 | 6/1980 | Hirosawa et al. | 377/15 |
| 4,213,190 | 7/1980 | Finlay et al. | 364/900 |
| 4,245,309 | 1/1981 | Kiefer | 371/20 |
| 4,275,464 | 6/1981 | Schmidt | 371/20 |

*Primary Examiner*—Jerry Smith
*Assistant Examiner*—Michael R. Fleming

[57] ABSTRACT

Briefly, the invention is a control and diagnostic system that monitors all possible machine events and activities that pass through microprocessor control. In case a fault is detected, the control will display the particular chain (subsystem) of the machine and the last successfully completed event which occurred in that chain and on the copy which caused the shutdown. These chain (subsystem) and event numbers are common to the components in a wide variety of machines and immediately provides a lower entry point in the usual fault isolation procedure. In another feature, subsystem sequencing, the Service Representative can select a chain number and then press start print. The machine will then display in sequence the numbers for the events in the selected chain as they occur and allow the Service Representative to selectively exercise the components. This feature can be provided for training purposes to aid in understanding sequence of subsystem operation. Another feature of the present invention is the use of dedicated registers in the controller to record completed events for the various chains and components in the reproduction machine. At shutdown the contents of the registers can be displayed to indicate the last completed event for a particular chain (subsystem) or for each of the chains (subsystems).

14 Claims, 9 Drawing Figures

DIRECTIVE DIAGNOSTICS

The invention relates to image marking machines and more particularly, to the use of diagnostics in image marking machines.

It is important to the maintenance of complex electronic equipment such as reproduction machines to reduce the service calls and time spent in monitoring and maintaining the machine operation, in particular reducing the cost of maintenance and service. Part of the problem is the lack of similarity of diagnostic procedures and codes between various machines. Often diagnostic procedures and trouble shooting codes for a particular machine are totally unique to that machine, and the Service Representative must learn each machine's diagnostic procedures and codes separately. It would be desirable, therefore, to provide standardized diagnostic procedures and codes for use in many machines which the Service Representative can use to correct malfunctions and maintain operation without the need for extensive retraining.

Reproduction machines comprise several interrelated subsystems (often referred to as stations or chains) such as the paper path station, the exposure/scan station, the xerographic station, the document handler station and the fuser station. Checking the operation of the machine, it is often necessary for the Service Representative to isolate on one of the stations or chains to the exclusion of the others. In doing so, the Service Representative is aided by status and maintenance codes displayed on a machine control panel to assist him or her in proper diagnosis and correction of machine malfunction. In prior art machines, however, there is generally no correlation or relationship between the codes and the particular chain being examined or diagnosed, nor was there any relationship in the sequence of codes that were displayed. This necessitated the resort by the Service Representative to extensive fault trees, charts and trouble shooting procedures to interpret the various codes into corrective procedures. It would be desirable, therefore, to eliminate the need for resort to extensive trouble shooting procedures during machine diagnostics, and it would be desirable to provide a diagnostic system in which the displayed codes are related to various chains and are displayed in a predetermined sequence.

It is well known in prior art reproduction machines to display various status and maintenance codes to assist the operator and service representative in correcting malfunctions. In prior art machines, diagnostic procedures were generally of a predictive nature. That is, the various status and maintenance codes that were displayed predicted the malfunction. The codes did not precisely monitor machine events. By machine events are meant sequential exchanges of hardware related input or output information within a microprocessor controller subsystem. When a successful event has occured, the chain or subsystem itself or a related chain or subsystem is allowed to advance to the next event. The status and maintenance codes indicated corrective procedures. The Service Representative did not know the precise condition of all the various components in a particular chain or subsystem in the machine at the specific time that the fault occurred. This is a more direct rather than predictive method of trouble shooting. It would be desirable, therefore, to provide the Service Representative with fault code information and in addition, information on the precise status of each event or component of the machine.

These prior art diagnostic procedures, as well as procedures for exercising various components in a reproduction machine including error and timing checks are disclosed in U.S. Pat. Nos. 4,035,072 and 4,156,133, assigned to the same assignee as the present invention. In addition, pending application U.S. Ser. No. 89,430 filed Oct. 30, 1979 teaches the capture and display of a first fault in a multisystem fault situation and U.S. Ser. No. 81,230 filed Oct. 2, 1979 teaches scan carriage timing diagnostics.

Therefore, it is a primary object of the present invention to provide a new and improved diagnostic system for a reproduction machine, in particular to provide a directive diagnostic system rather than a predictive diagnostic system. It is a further object of the present invention to be able to track events in a sequential manner to provide the Service Representative with the last successful event completed, rather than to determine conditions in retrospect. It is another object of the present invention to correlate display codes with events and chains in a variety of reproduction machines.

Briefly, the present invention is a control and diagnostic system that monitors all possible machine events and activities that pass through microprocessor control. In case a fault is detected, the control will display the particular chain (subsystem) of the machine and the last successfully completed event which occurred in that chain and on the copy which caused the shutdown. These chain (subsystem) and event numbers are common to the components in a wide variety of machines and immediately provides a lower entry point in the usual fault isolation procedure. In another feature, subsystem sequencing, the Service Representative can select a chain number and then press start print. The machine will then display in sequence the numbers for the events in the selected chain as they occur and allow the Service Representative to selectively exercise the components. This feature can be provided for training purposes to aid in understanding sequence of subsystem operation. Another feature of the present invention is the use of dedicated registers in the controller to record completed events for the various chains and components in the reproduction machine. At shutdown the contents of the registers can be displayed to indicate the last completed event for a particular chain (subsystem) or for each of the chains (subsystems).

Other objects and advantages of the present invention will become apparent upon reading the following detailed description and upon reference to the drawings wherein the same reference numerals have been applied to like parts and wherein.

Figure 1:
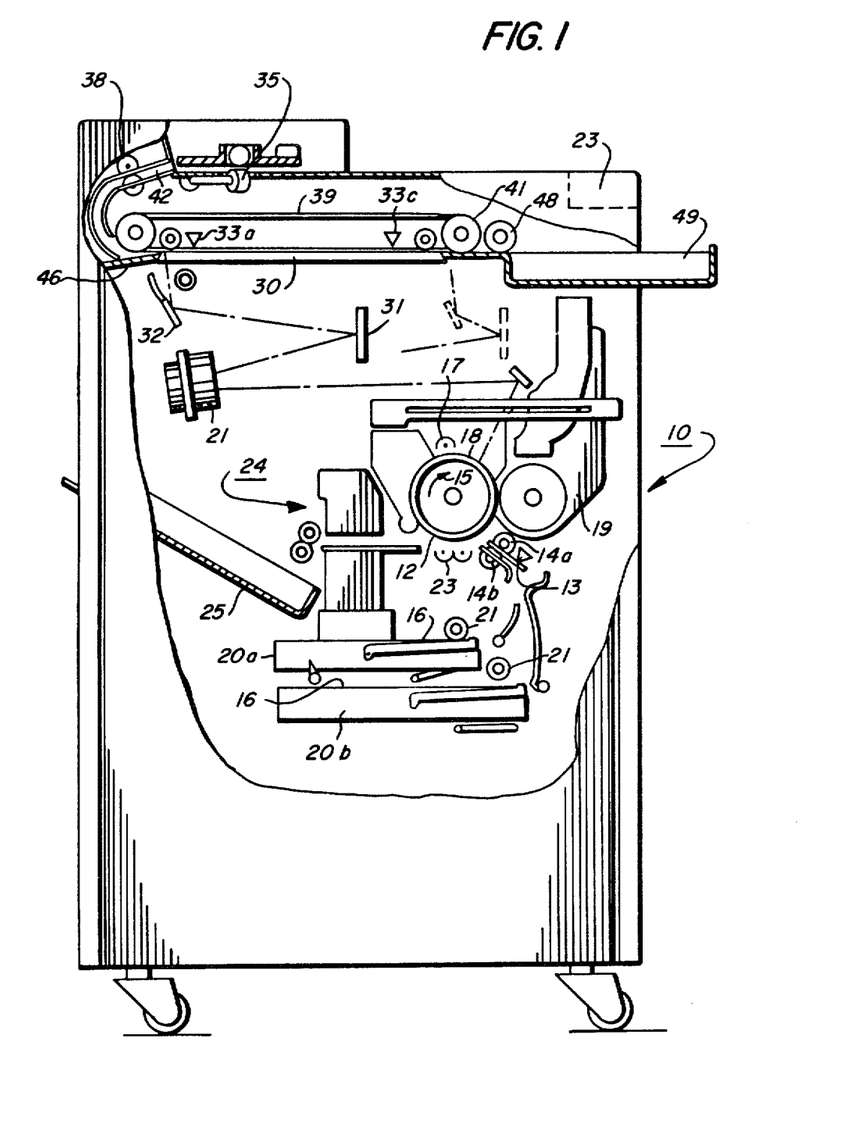
FIG. 1 is an elevational view of a reproduction machine incorporating the present invention.

Referring now to FIG. 1, there is shown by way of example of reproduction machine 10 including an image recording drum-like member 12, its outer periphery coated with a suitable photoconductive surface. The drum 12 moves the photoconductive surface in the direction of arrow 15 through a charging station 17 providing an electrostatic charge uniformly over the photoconductive surface.

Thereafter, the drum 12 is rotated to exposure station 18 and the charged photoconductive surface is exposed to a light image of the original document to be reproduced. The charge is selectively dissipated in the light exposed regions to record the original document in the form of an electrostatic latent image. After exposure drum 12 rotates the electrostatic latent image recorded on the photoconductive surface to development station 19 wherein a conventional developer mix is applied to the photoconductive surface of the drum 12 rendering the latent image visible.

Copy sheets 16 of the final support material are supported in a stack arrangement on either elevating stack main tray 20a or auxiliary tray 20b. With the stack at its elevated position, a sheet separator 21 feeds individual sheets therefrom to a registration system. The registration system includes registration switch 13 and registration rolls 14a and 14b. A copy sheet 16 is registered in the nip of register rolls 14a and 14b before transfer.

The sheet is then forwarded to the transfer station in proper registration with the image on the drum 12. The developed image on the photoconductive surface is brought into contact with a copy sheet 16 and the toner image is transferred from the photoconductive surface to the contacting side of the copy sheet 16. Following transfer of the image the final support material is transported through a detack station where detack corotron 23 uniformly charges the support material to separate it from the drum 12.

The copy sheet 16 is then advanced to a suitable fusing station 24 for coalescing the transferred powder image to the support material. After the fusing process, the copy sheet 16 is advanced to a suitable output device such as tray 25.

The original document to be reproduced is placed image side down upon a horizontal transparent plate 30 and scanned by means of a moving optical system. The scanning system includes a stationary lens 21 and a pair of cooperating movable scanning mirrors. The scanning mirrors include a half rate mirror 31 and full rate mirror 32 supported upon carriages (not illustrated). Disposed along the platen 30 are a scan switch 33a and an end of scan switch 33c.

A document handler is also provided including a registration assist roll 35 activated when a document is inserted. Pinch rolls 38 are activated to feed the document around 180 degree curved guides 42. The document is driven onto the platen 30 by a platen belt transport 39. After copying, the platen transport 39 is activated and the document is driven off the platen by the output pinch roll 48 into the document catch tray 49.

Figure 2:
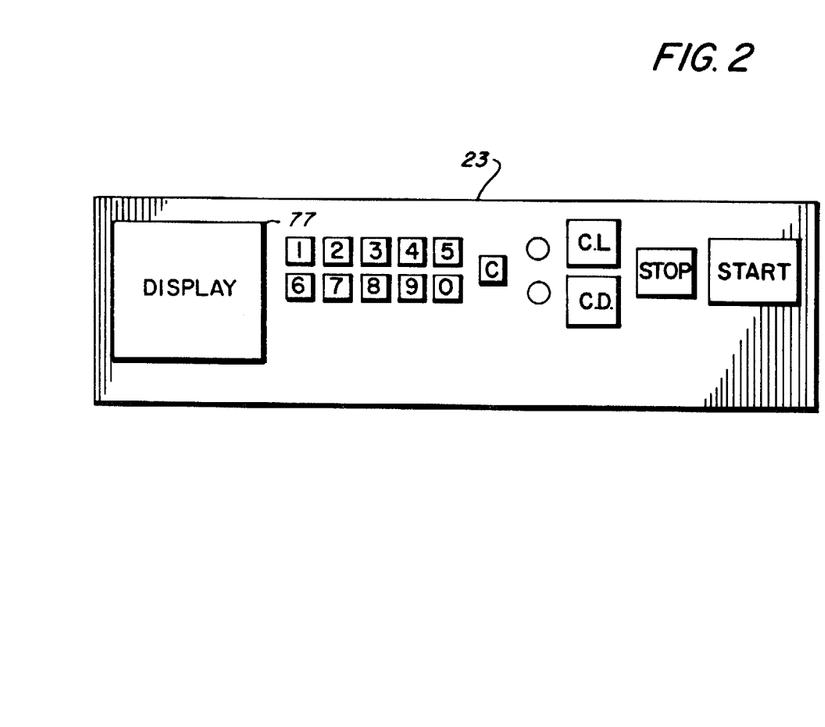
FIG. 2 illustrates the control panel of the machine shown in FIG. 1.

With reference to FIG. 2, there is shown the machine control panel 23 including a keyboard with a two digit display 77, a start switch, a stop switch, a copy lighter (CL) switch with indicator lamp, and a copy darker (CD) switch with indicator lamp. The control panel switches and indicators are connected to the machine control as shown in FIG. 3.

Figure 3:
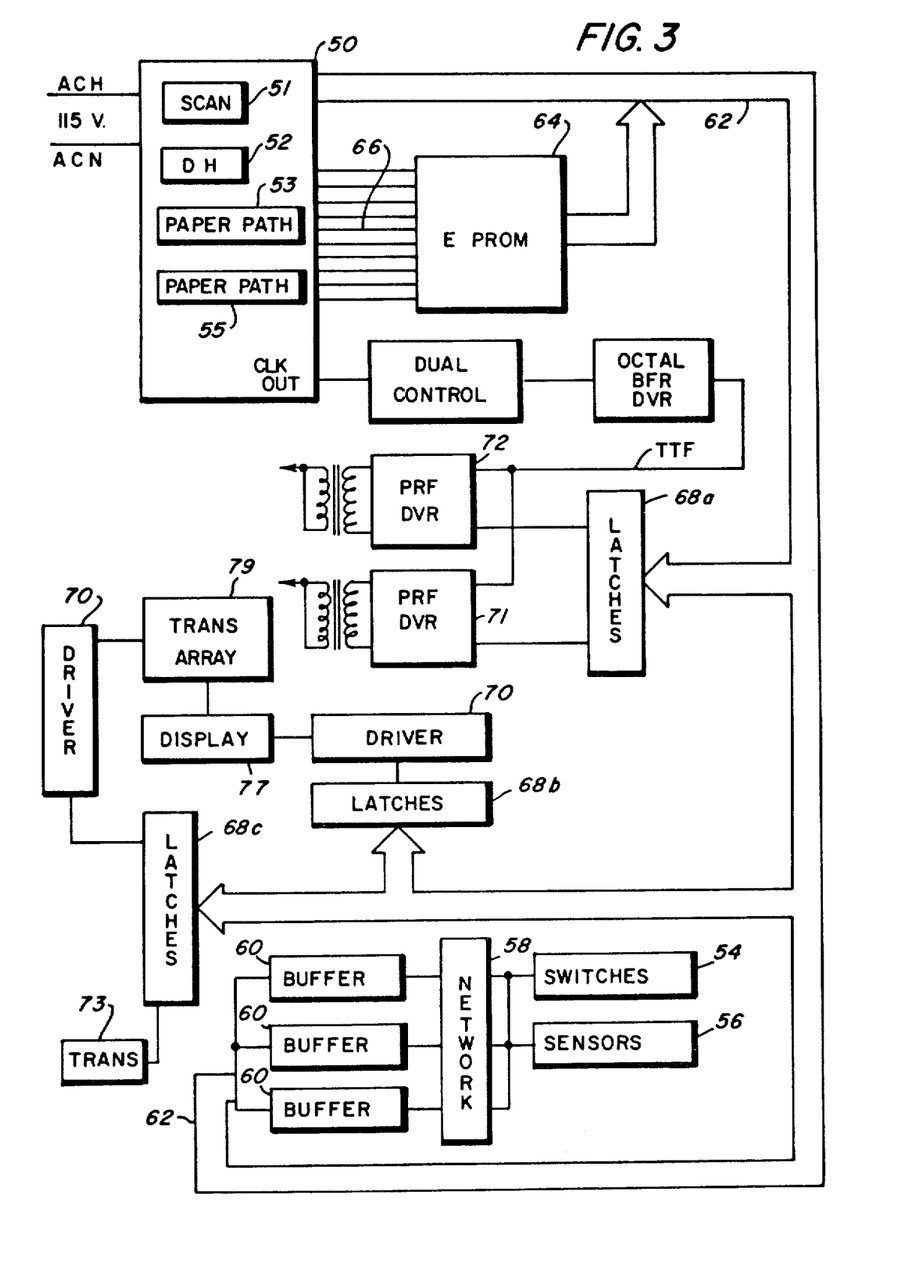
FIG. 3 is a block diagram illustrating the controller of the reproduction machine of FIG. 1.

With reference to FIG. 3, there is shown a controller including microprocessor 50 with four dedicated registers, a scan register 51, a document handler register 52, and a pair of paper path registers 53 and 55. The reproduction machine also includes other, not shown, power supplies and distribution circuitry. A bidirectional bus 62 interconnects the microprocessor 50 and the reproduction machine and generally conveys signals from sensors 56 and switches 54 of the reproduction machine to microprocessor 50 and conveys control signals from microprocessor 50 to the reproduction machine.

The signals of various reproduction machine switches 54 and sensors 56 are conveyed through a resistance network 58 and suitable buffers 60 to the 8 bit external data bus 62 connected to microprocessor 50. The 8 bit data bus 62 is also connected to a suitable memory device such as EPROM 64 interconnected to microprocessor 50 through suitable address lines 66. It should be noted that the EPROM device 64 can be replaced by a suitable read only memory ROM internal to the microprocessor 50.

Outputs to the reproduction machine controlled elements are conveyed from the microprocessor 50 along the external data bus 62 to various latches 68a, 68b and 68c. The latches are interconnected to various drivers 70, 71 and 72, or transistors 73 to activate various clutches, solenoids, motor drives, triacs and power supplies in the reproduction machine. For a more detailed description of the control, reference is made to copending U.S. Ser. No. 80,624 entitled "Open Loop Controller" and U.S. Ser. No. 111,048, entitled "Fuser Control" incorporated herein.

In accordance with the present invention, for purposes of diagnostics, the reproduction machine is divided into separate stations or chains (subsystems) and individual components within each chain.

TABLE I

| Process | Chain Number | Component Number | Inputs | Outputs |
|---|---|---|---|---|
| Document Processing | 5 | 0 | Prefeed | |
| | 5 | 1 | | Skuffer Motor |
| | 5 | 2 | Feed | |
| | 5 | 3 | | Forward Motor |
| | 5 | 8 | | Reverse Motor |
| Optics | 6 | 1 | | Scan Clutch |
| | 6 | 2 | Scan Switch | |
| Paper Processing | 8 | 1 | | Paper Feed Clutch (selected tray) |
| | 8 | 2 | Feed-in Switch | |
| | 8 | 5 | Feed-out Switch | |

For example, with reference to Table I, above, document processing in the document handler is referred to as chain number 5 and includes an input prefeed switch, component number 0, an input feed switch, number 2, an output skuffer motor, number 1 and output forward and reverse motors, numbers 3 and 8.

The optics station is number 6 and includes scan clutch, component number 1 and scan switch, component number 2. The copy sheet processing is chain 8 and includes the feed-in switch, component number 2, the feed-out switch, number 5, and paper feed clutch, number 1.

To enter the diagnostic state, preferably, the following procedure is used. While activating the number "0" on the keyboard (see FIG. 2), a (not shown) power on switch is activated. If the system is in diagnostics, a predetermined number appears in display 77 on the reproduction machine operator console or control panel. With the main power off, the system exits diagnostics. To access a diagnostic routine or procedure, it is necessary to enter the proper test code number (chain number and test number) using the panel keyboard on the operator console. To exit a particular routine, enter another test number. To exit the chain, it is necessary to press a keyboard switch (i.e. clear) on the panel.

To test or exercise a particular component while in the diagnostic state, it is first necessary to enter the chain number and component or test number from the control panel. Once chain number is entered, any tests within that chain can be performed without re-entering the chain number. For component input tests, activating the input component selected will activate the component control. The test will track the logic level at the printed wiring board assembly (PWBA). That is, the indicators (i.e. copy lighter/darker LEDs are off) if the input is ground. The indicator LEDs are on if the input is high. For component output tests, entering the output component number selected will activate the component control. Pressing a control switch (i.e. start print) will energize the particular component. Pressing a control swtich (i.e. stop print) will de-energize the particular component.

To test process timing while in the diagnostic state, it is necessary to enter a chain number, then a given test number. The display will indicate the time in real time (seconds/milliseconds). To start the test, "start print" is pressed. To stop the test, "stop print" is pressed. For example, Table II lists various tests in paper processing:

TABLE II

| Chain | Test No. | Time Measurement |
|---|---|---|
| 8 | 51 | Paper Feeder ON to Feed-in Switch Actuation |
| 8 | 52 | Scan Clutch ON to Feed-in Switch Deactuation |
| 8 | 53 | Feed-in Switch Deactuate to Feed-out Switch Actuation |
| 8 | 54 | Feed-out Switch Actuation to Feed-out Switch Deactuation |

Figure 4:
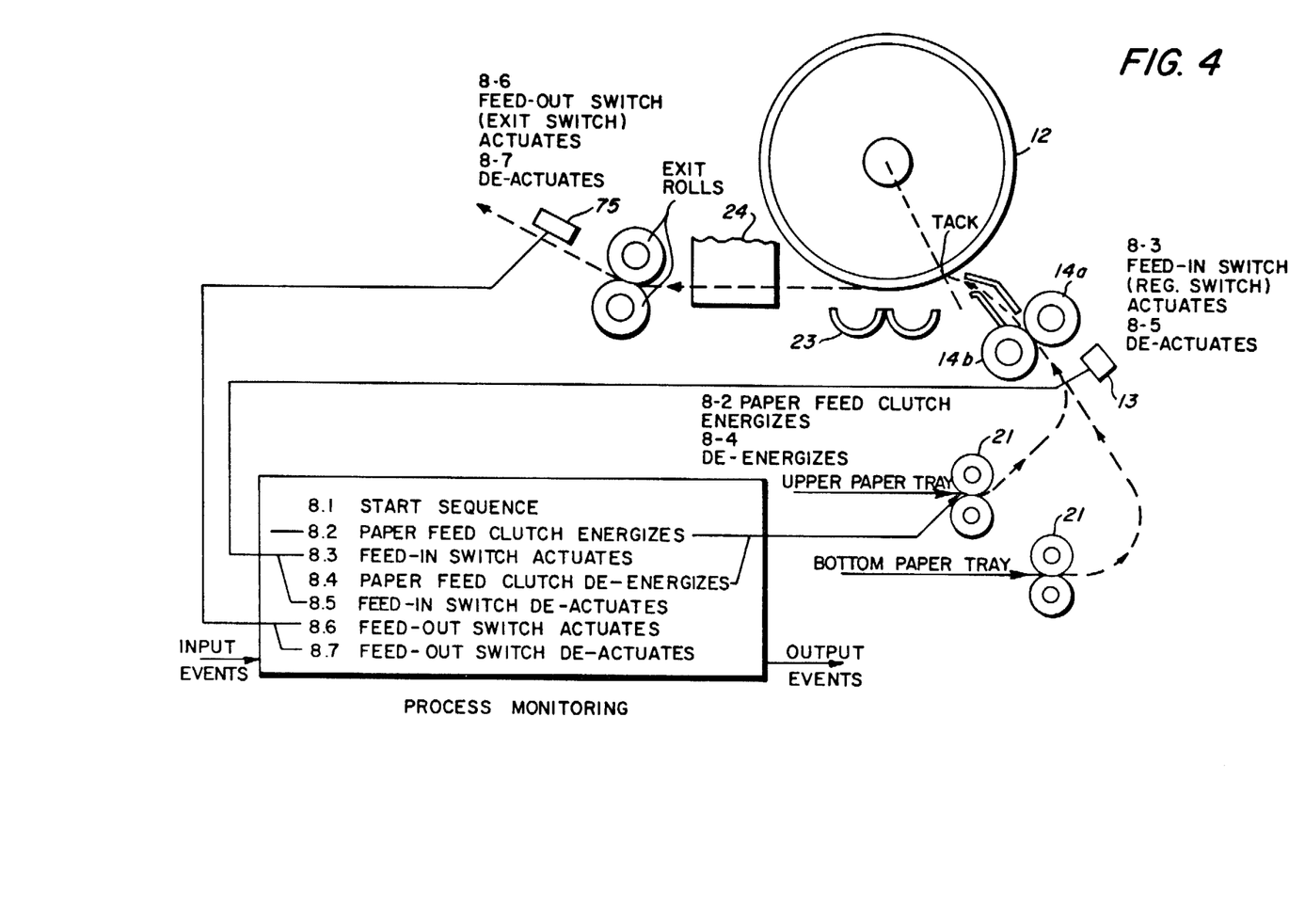
FIG. 4 is a detailed schematic of the paper handling subsystem of the reproduction machine in accordance with the present invention.

With reference to FIG. 4, in accordance with the present invention, there is shown a transfer station in detail. As exemplary of the present invention, the sequence in the transfer of the image to a copy sheet (chain 8) can be broken down into six distinct events as identified in Table III. The six events relate to activity of three components listed in Table 1, specifically, the actuation/deactuation or energized/de-energized status of these components.

TABLE III

| Sequence Event Number | Component Action |
|---|---|
| 1 | Start Sequence |
| 2 | Paper Feed Clutch Energizes |
| 3 | Feed-in Switch Actuation |
| 4 | Paper Feed Clutch De-energize |
| 5 | Feed-in Switch De-actuates |
| 6 | Feed-out Switch Actuates |
| 7 | Feed-out Switch De-actuates (Indicates Completion of Subsystem) |

In accordance with the present invention, this is a breakdown of the paper processing (chain 8) into its most elemental steps or events which the microprocessor controls. Chain 8 is typical of the breakdown of all the chains or stations (subsystems) of the reproduction machine into elemental events for diagnostics.

In particular, there is the start of sequence, the paper feed clutch energization to feed a copy sheet from trays 20a, 20b, and the lead edge of the copy sheet actuating the registration or feed in switch 13. Then, the paper feed clutch is de-energized, a not shown scan controlled paper gate lifts and the trail edge of a sheet deactuates the switch 13. Finally, the lead edge of the sheet actuates the exit or feed out switch 75, and the trail edge of the sheet deactuates the switch 75.

The indicators 8.1-8.7 are displayed to indicate completed events. For example, an 8.2 shows that the paper feed clutch has been energized. It should be understood, however, that a display sequence 8.0-8.6 could be used. With this type of display format, the display would indicate the next event to be completed rather than a completed event. In other words, an 8.2 display would indicate that a feed in switch actuation signal was not recorded.

Figure 5:
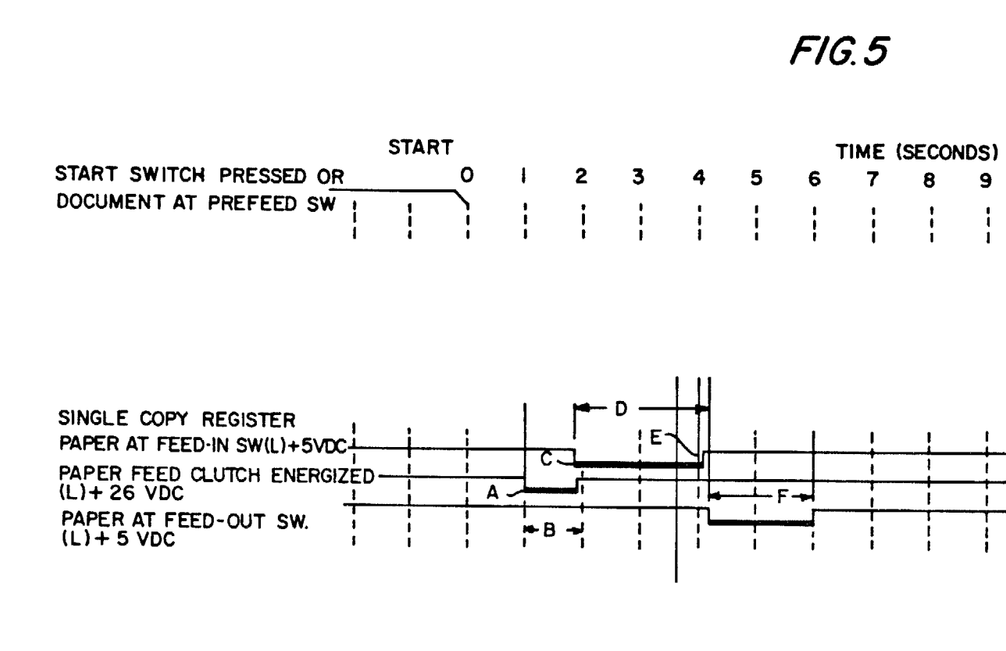
FIG. 5 is a typical timing diagram in accordance with the present invention.

A typical timing diagram is illustrated in FIG. 5. For example, at A the paper feed clutch is energized. The time period B is the time for the paper to reach the feed in switch 13. At C, the paper activates the feed in switch 13. The time period D is the time that the paper is under the feed in switch. At point E, the paper leaves the feed in switch and the time period F is the time that the paper is sensed at the feed out switch 75.

In accordance with the present invention, consider that the copy sheet does not reach the registration switch. Therefore, event 83 has not yet been completed and will result in a jam.

The jam will cause a "C4" code to be displayed. It is well known in the prior art to display suitable codes representing jam conditions. In a typical prior art machine, the jam code "C4" would signify an out of paper condition or a paper misfeed. In accordance with the present invention, however, an additional chain and event number can be displayed after the jam code. The chain and event number, in this case 82, indicating the last successfully completed event, provides additional information to the Service Representative and in many instances simplifies trouble-shooting.

The last successful event in the sequence would be an 82, or the energization of a paper feed clutch. The Service Representative will then be directed in the trouble-shooting procedure to test the registration switch, that is the component control for the switch agrees with the maintenance code displayed, in this case "82". If appropriate, the clutch would be checked. If the last event displayed was an 81, and there was also a C4 jam condition, the implication would be that the paper feed clutch was not energized. That is, a signal was not sent to activate the clutch. Since this is not a likely result, the conclusion is that the microprocessor, in fact, did not provide the proper signal. This would indicate an erratic condition possibly caused by an intermittent sensing component in another subsystem. The 80 maintenance code associated with an E2 or E4 status code would also indicate a power problem which may have reset the microprocessor.

There is an order or hierarchy of problems that are handled. For first order type problems such as normal operating conditions and simple jams, only certain sequence numbers related to the components in a chain would occur. For example, 82, 84, 85, and 86 are directly related to jam conditions and prior art jam codes.

If the diagnostic package dealt only with the first order type problems, then these numbers could be eliminated using jam code numbers where a specific malfunction is related. This is basically what is done in the prior art.

In accordance with the present invention, however, a hierarchy of problems can also be analyzed and monitored using the chain and event numbers.

For example, consider the condition of the feed-in switch 13 remaining closed after a copy sheet passes. The display would provide a jam indication, for example, an E2 code. The display would also provide an 84 indicating that the last completed event was the paper feeder clutch deenergized. Having this information available, in particular, the jam condition as well as the last completed event, it can be concluded that there is a defective switch and/or a multifeed. Thus the code 84 provides more detail for problem resolution. In this case, the operator or Service Representative can quickly determine the multifeed status.

For another example, consider an intermittent feed-in switch or momentary deactuation with paper under the switch. The display would be an E3/83. The 83 indicates that the feed-in switch actuated a second time before the trail edge left the switch 13. With the use of the code 83, it is much easier to diagnose this type of intermittent fault. In particular, in this case, it could be caused by a false trail edge signal.

Other problems are extreme conditions causing the controller to operate out of sequence. For example, during operation, conditions can occur such as an open door, a power monitor trip, an auditron removal condition, or hitting stop print. These are often problems that are intermittent and asynchronous in nature and can cause the processor to operate in an unpredictable manner. The chain and event numbers can provide the pattern which is needed to isolate the contributing factors.

Figure 6A:
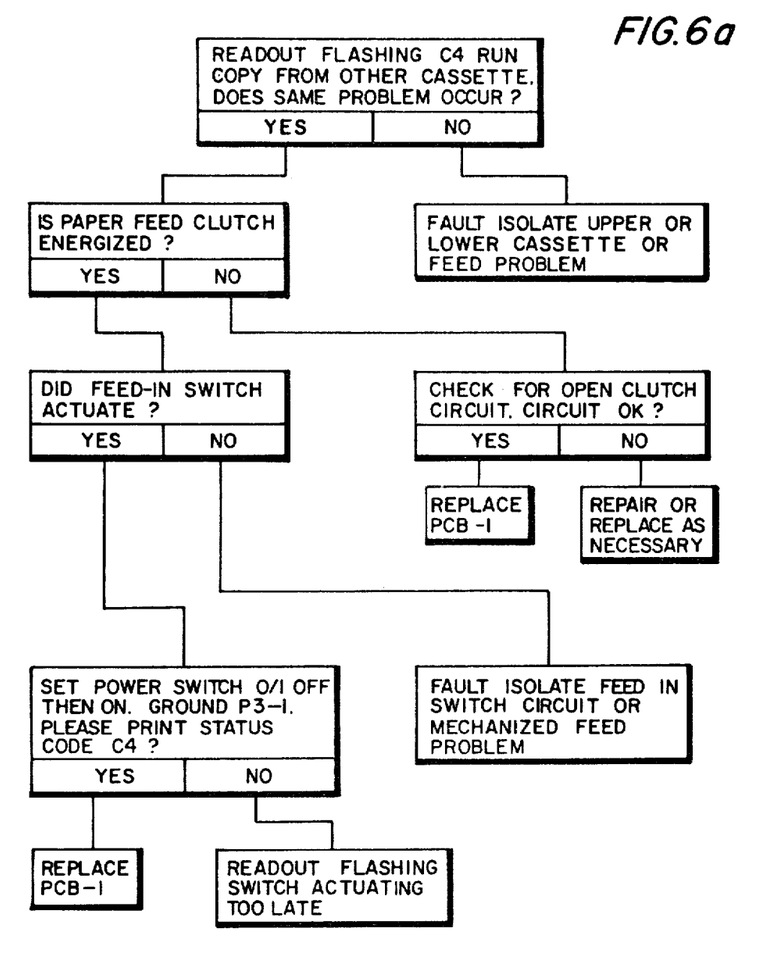
FIGS. 6a, 6b, 7a and 7b are typical prior art fault isolation procedures for troubleshooting the paper handling subsystem and the scan drive subsystem.
Figure 6B:
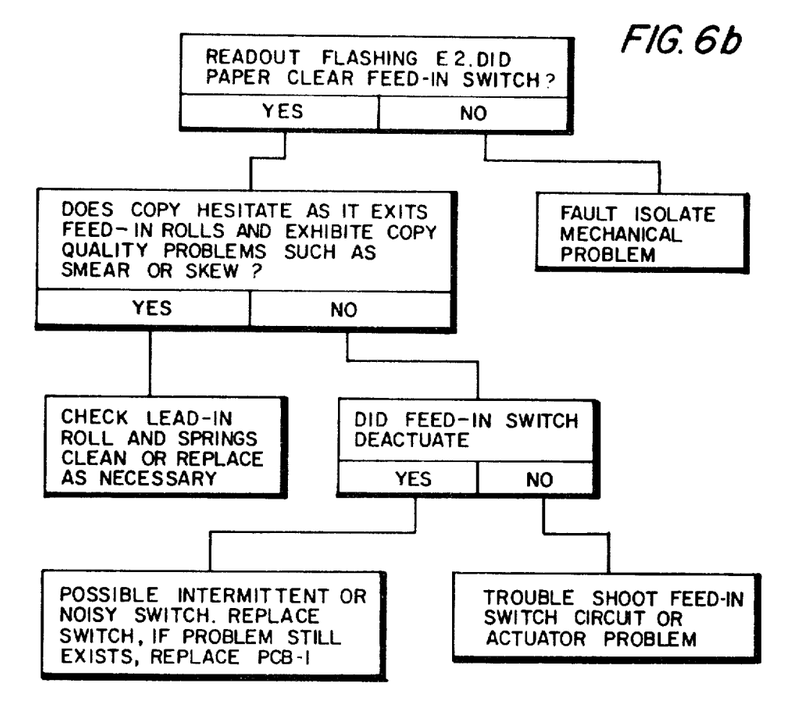
Figure 7A:
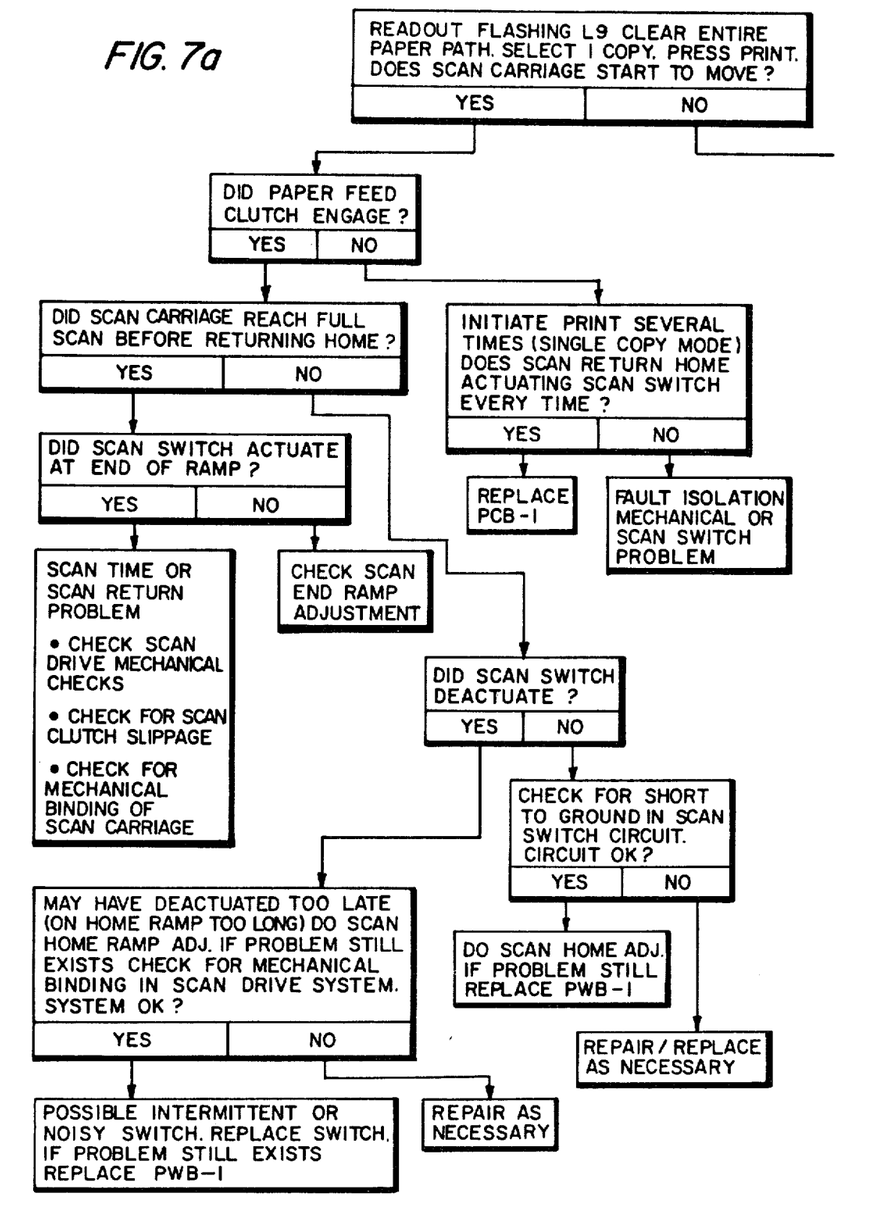
Figure 7B:
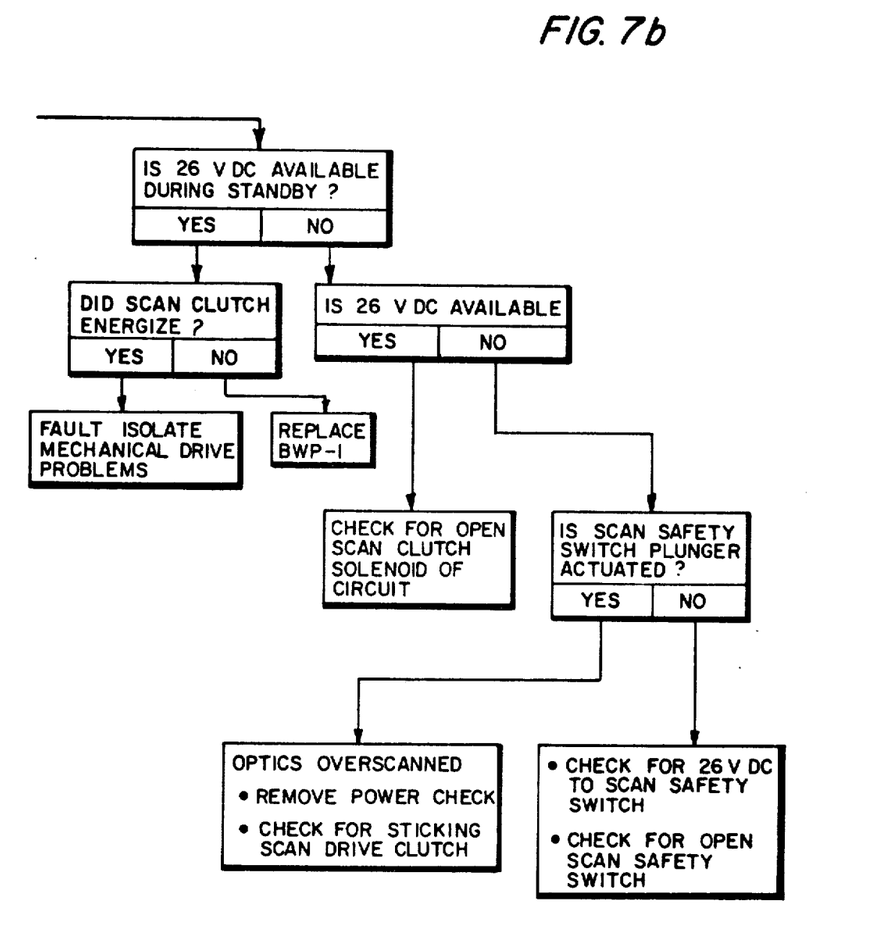

With respect to FIGS. 6 and 7, there are illustrated typical prior art fault isolation procedures. For example, the Service Representative would follow through the fault trees beginning with the first block. For example, (see FIG. 7) if a particular fault L9 was indicated, the Service Representative would clear the paper path, select one copy and press print. If the scan carriage started to move, then the Service Representative would check the paper feed clutch. If the scan carriage did not move, then the Service Representative would check to see if the proper voltage was available during standby. No matter what the particular fault, the Service Representative would proceed through the step by step procedure to isolate the problem. For example, if there was a noisy or intermittent scan switch, the Service Representative would proceed through all the steps until reaching the point at the end of the flow chart concerning possible intermittent or noisy switches.

TABLE IV
CHAIN 6 "L9" SCAN DRIVE FAULT ISOLATION PROCEDURE

| MAINT. CODE | UNSUCCESSFUL EVENT | PROCEDURE | NORMAL INDICATIONS | CORRECTIVE ACTIONS |
|---|---|---|---|---|
| 6-0 | Sequence did not start. | 1. Check for intermittently shorted scan switch.<br>2. Refer to note 1. | 1. Scan switch deactuated signal should be available during scan.<br>2. Refer to note 1. | 1. Go to chain 6.2 and check for shorted scan switch or wiring.<br>2. Replace PWB 1. |
| 6-1 | Scan drive clutch energized signal did not occur. | 1. Test scan switch. Input component control number 6-2.<br>2. Refer to note 1. CARRIAGE DOES NOT MOVE: | 1. COPY LIGHTER/DARKER indicators are off as scan switch is actuated on scan home ramp.<br>2. Refer to note 1. | 1A. Go to chain 6.2 and check for open scan switch or wiring.<br>1B. Check scan home ramp adjustment.<br>2. Replace PWB 1. |
| 6-2 | Scan switch deactuated signal did not occur. | 1. Test scan drive clutch. Output component control number 6-1.<br>2. Operate copier and observe drives.<br>3. Refer to note 1. CARRIAGE MOVES:<br>1. Test scan switch. Input component control number 6-2.<br>2. Perform timing test 6-51.<br>3. Refer to note 1. | 1. Scan clutch energizes when START is pressed.<br>2. Scan clutch should be engaged and scan drive should be available.<br>3. Refer to note 1.<br>1. COPY LIGHTER/DARKER indicators are on a scan switch is deactuated off scan home ramp.<br>2. Display should read .040 to 140 milliseconds. L9 indicates failed test.<br>3. Refer to note 1. | 1. Go to chain 6.2 and check scan clutch and scan safety switch circuit.<br>2. Replace defective scan clutch or drive component.<br>3. Replace PWB 1.<br>1A. Go to chain 6.2 and check for shorted scan switch or wiring.<br>1B. Check scan home ramp adjustment.<br>2. Check scan home ramp adjustment.<br>3. Replace PWB 1. |
| 6-3 | Scan switch actuated signal did not occur at end of scan. | 1. Test scan switch. Input component control number 6-2.<br>2. Perform timing test 6-52.<br>3. Check for intermittently shorted or open scan switch.<br>4. Check for intermittently shorted or open scan switch.<br>5. Refer to note 1. | 1. COPY LIGHTER/DARKER indicators go off as carriage is manually moved to scan end and switch is actuated on scan end ramp.<br>2. Display should read 2.27 to 2.42 seconds. L9 indicates failed test.<br>3. Scan switch deactuation signal should be available during scan.<br>4. Check scan carriage for for smooth operation.<br>5. Refer to note 1. | 1. Check scan end ramp and scan switch for actuation at end of scan.<br>2A. Check end of scan ramp adjustment.<br>2B. Check scan clutch for slipping or binding.<br>3. Go to chain 6.2 and check scan switch wiring.<br>4. Go to chain 6.2 and check scan clutch wiring.<br>5. Replace PWB 1. |
| 6-4 | Scan drive clutch de-energized signal did not occur. | 1. Test scan switch input component control number 6-2.<br>2. Refer to note 1. | 1. Scan switch actuated signal should be available at P3-13 with carriage in home position.<br>2. Refer to note 1. | 1A. Check scan switch over travel.<br>1B. Check scan home ramp adjustment.<br>2. Replace PWB 1. |
| 6-5 | Scan switch actuated signal did not occur when scan carriage returned home. | 1. Test scan switch input component control number 6-2.<br>2. Perform scan return timing test 6-53.<br>3. Check for intermittently shorted | 1. COPY LIGHTER/DARKER indicators should be off when scan switch switch is actuated by scan home ramp.<br>2. Display should read 400 to 600 milliseconds. L9 indicates failed test.<br>3. Scan switch deactuated signal should | 1. Check scan home ramp adjustment.<br>2A. Check scan return adjustment.<br>2B. Clean optics rails.<br>2C. Check for clutch binding or sticking on return.<br>3. Go to chain 6.2 and check |

TABLE IV-continued
CHAIN 6 "1.9" SCAN DRIVE FAULT ISOLATION PROCEDURE

| MAINT. CODE | UNSUCCESSFUL EVENT | PROCEDURE | NORMAL INDICATIONS | CORRECTIVE ACTIONS |
|---|---|---|---|---|
| | | or open scan switch. <br> 4. Check for intermittently shorted or open scan clutch <br> 5. Refer to note 1. | be available during scan. <br> 4. Check scan carriage for smooth operation during flyback. <br> 5. Refer to note 1. | scan switch wiring. <br> 4. Go to chain 6.2 and check scan clutch wiring. <br> 5. Replace PWB 1. |

NOTE 1.
Verify PWB 1 failure by switching power on/off several times. With power-on, display should indicate #1. "LL" indicates failed test.

TABLE V

CHAIN 8/10 - C4, E2, E3/E4 PAPER PATH FAULT ISOLATION PROCEDURE

| MAINT. CODE | UNSUCCESSFUL EVENT | PROCEDURE | NORMAL INDICATIONS | CORRECTIVE ACTIONS |
|---|---|---|---|---|
| 8-0 | Sequence did not start. | E2 Status Code<br>1. Test feed-in switch input component control number 8-2.*<br>E4 Status Code<br>1. Test feedout switch input component control number 8-5.* | 1. COPY LIGHTER/DARKER indicators are on when feed-in switch is de-actuated.<br><br>1. COPY LIGHTER/DARKER indicators are on when feedout switch is de-actuated. | 1. Check for actuated feed-in switch or short in feed-in switch circuit. #<br><br>1. Check for actuated feedout switch or short in feedout switch circuit. # |
| 8-1 | Paper feed clutch energized signal did not occur. | E2 Status Code<br>1. Check for intermittently open scan switch.<br>2. Check for intermittently open scan circuit.<br>3. Refer to note 1.<br>C4 Status Code - Paper did not feed:<br>1. Check paper trays.<br>2. Test paper feed clutch output component control number 8-1.<br>3. Operate copier and observe paper feed drives.<br>4. Refer to Note 1.<br>C4 Status Code - Paper feeds: | 1. Scan Switch actuated signal should be available with carriage in home position.<br>2. Scan drive clutch energized signal should be OVDC during scan.<br>3. Refer to note 1.<br><br>1. Tray selected has paper.<br>2. Paper feed clutch energizes when print is pressed.<br>3. Paper feed clutch should be engaged and feed drive present.<br>4. Refer to Note 1. | 1A. Check scan switch for over travel.<br>1B. Check scan home ramp.<br>2. Go to Chain 6.2 and check scan clutch circuit.<br>3. Replace PWB 1.<br><br>1. Refill or reselect correct tray.<br>2. Go to Chain 8.2 and check for open paper feed clutch or circuit.<br>3. Go to mechanical inspection charts 8.2.1 and check items 1 and 2.<br>4. Replace PWB 1 |
| 8-2 | Paper at feed-in switch actuated signal did not occur. | 1. Test feed-in switch input component control number 8.2.<br>2. Perform timing test 8-51 (C4 window).<br>3. Refer to note 1.<br>E2 Status Code | 1. COPY LIGHTER/DARKER indicators go off when feed-in switch is actuated.<br>2. Display should read 560 to 1000 milliseconds. C4 indicates a failed test.<br>3. Refer to note 1. | 1. Go to Chain 8.2 and check for open feed-in switch or circuit.<br>2. Go to mechanical inspection charts 8.2.1, items 1-4 and 8.3.1 item 1.<br>3. Replace PWB 1. |
|  |  | 1. Test feed-in switch input component control number 8.2.<br>2. Perform timing test 8-51 (C4 window).<br>3. Refer to note 1.<br>E3 Status Code | 1. COPY LIGHTER/DARKER indicators are on when feed-in switch is de-actuated.<br>2. Display should read 560 to 1000 milliseconds. C4 indicates a failed test.<br>3. Refer to note 1. | 1. Go to Chain 8.2 and check for shorted feed-in switch or circuit.<br>2. Go to mechanical inspection charts 8.2.1, items 1-4 and 8.3.1 item 1.<br>3. Replace PWB 1. |
| 8-3 | Paper feed clutch de-energize signal did not occur. | 1. Check for intermittently closed feed-in switch.<br>2. Refer to note 1.<br>E2 Status Code | 1. Feed-in switch should de-actuate when paper trail edge clears switch.<br>2. Refer to note 1. | 1. Go to Chain 8.3 and repair switch, actuator or wiring.<br>2. Replace PWB 1. |
| 8-4 | Feed-in switch de-actuate signal did not occur. | 1. Test feed-in switch input component control number 8-2.<br>2. Test paper feed clutch. Output component control number 8-1.<br>3. Perform timing test 8-52.<br>4. Refer to note 1. | 1. COPY LIGHTER/DARKER indicators are on when feed-in switch is de-actuated.<br>2. Paper feed clutch energizes when start is pressed and de-energizes when stop is pressed.<br>3. Display should read 2.61 to 2.94 seconds. E2 indicates failed test.<br>4. Refer to note 1. | 1. Go to Chain 8.3 check for shorted switch or circuit.<br>2. Go to Chain 8.2 and check paper feed clutch circuit for shorts.<br>3. Go to mechanical inspection chart 8.3.1 and check items 1-6.<br>4. Replace PWB 1. |

TABLE V-continued
CHAIN 8/10 - C4, E2, E3/E4 PAPER PATH FAULT ISOLATION PROCEDURE

| MAINT. CODE | UNSUCCESSFUL EVENT | PROCEDURE | NORMAL INDICATIONS | CORRECTIVE ACTIONS |
|---|---|---|---|---|
| | | EE3 Status Code<br>1. Check for intermittently open or shorted feed-in switch.<br><br>2. Refer to note 1.<br>C4 Status Code<br>1. Check for intermittently shorted or open feed-in switch.<br><br>2. Check for intermittently open scan switch.<br><br>3. Refer to note 1.<br>E3 Status Code | 1. Feed-in switch should be actuated when paper is under switch, and deactuated with no paper under switch.<br>2. Refer to note 1.<br><br>1. Feed-in switch de-actuated signal should be available as copy trail edge clears switch. Feed-in switch actuates signal should be available with paper under switch.<br>2. Scan switch actuated signal should be available with carriage in home position.<br>3. Refer to note 1. | 1. Go to Chain 8.3 and check actuator, switch and wiring.<br><br>2. Replace PWB 1.<br><br>1. Go to Chain 8.3 and repair actuator or replace switch or wiring.<br><br>2A. Check scan switch for over travel.<br><br>2B. Check scan home ramp.<br>3. Replace PWB 1. |
| 8-5 | Paper at feedout switch actuated signal did not occur. | 1. Test feedout switch. Input component control number 8-5.<br>2. Perform timing test 8-53.<br><br>3. Check for intermittently open feedout switch.<br>4. Check for intermittently open shorted feed-in switch.<br>5. Refer to note 1.<br>E4 Status Code | 1. COPY LIGHTER/DARKER indicators go off as feedout switch is actuated.<br>2. Display should read 0.000 to 420 milliseconds. E3 indicates failed test.<br>3. Feedout switch should actuate when paper travels under the switch.<br>4. Feed-in switch should actuate when paper travels under switch, and de-actuates with paper.<br>5. Refer to note 1. | 1. Go to Chain 10.2 and check feedout switch and circuit for opens.<br>2. Check for copy transportation mechanical problem and feedout switch adjustment.<br>3. Repair or replace feedout switch, actuator or wiring.<br>4. Repair or replace feed-in switch, actuator or wiring.<br>5. Replace PWB 1. |
| 8-6 | Feedout switch de-actuated signal did not occur. | 1. Test feedout switch. Input component control number 8-5.<br>2. Perform timing test 8-54.<br><br>3. Refer to note 1. | 1. COPY LIGHTER/DARKER indicators go on when feedout switch is actuated.<br>2. Display should read 1.94 to 2.38 seconds. E4 indicates failed test.<br>3. Refer to note 1. | 1. Feedout switch sticking or held actuated. Replace actuator or switch.<br>2A. Check for copy transportation mechanical problem.<br>2B. Check feedout switch adjustment.<br>3. Replace PWB 1. |

*Enter diagnostics then press clear to maintain 6L in display.
If switch is not actuated or shorted maintenance code 8.0 denotes a power monitor trip. Check for a low 5VCD or a low line condition.
NOTE 1.
Verify PWB 1 failure by switching power on/off several times. With power-on, display should indicate #1. "LL" indicates failed test.

In accordance with the present invention, however, a much simpler procedure for trouble shooting is available. With reference to Table IV, there is shown a simplified procedure for an L9 fault code using the chain and event codes in combination with the usual fault identification codes, Example: L9/62.

With reference to Table V, the first column indicates the maintenance code. The last successful controller event is the key to enter the chart. The chart provides the corrective action for the next event which failed to occur.

In particular, the procedure column gives a direct action to be performed in order of importance and the testing results. In most cases, it recommends the use of either an input or output component control test. For example, with an 8-2 maintenance code and a C4 status code, the procedure is to first check the paper trays, then test paper feed clutch output component control, and then to operate the copier and observe the paper feed drive.

The normal indication column indicates the successful results of the recommended testing given in the procedure column. If a test is correct, then the Service Representative goes to the next recommended test or procedure. If the test is unsatisfactory, then the Service Representative would go to the recommended corrective action column.

The corrective action column gives the fault isolation method for any unsatisfactory test and is followed only when the test is unsatisfactory. It provides an exit from the chart to either service data or to more detailed trouble shooting methods covering a circuit or suspected component.

For example, assuming 6 sequential events have to occur within the chain, if event 2 appeared in the display 77, i.e. 82, this would identify that chain 8 proceeded successfully only to event 2. The Service Representative would enter the chart or Table V troubleshooting procedure at event 2. The chart indicates the activities that did not occur. This is the point where the fault isolation begins.

In addition, the controller is monitoring all the other chains or subsystems in the copier. If an additional fault occurs in another chain or subsystem, the controller will flash a new status code on display 77 indicating a new priority. It will be then necessary for the Service Representative to fix the new problem before continuing with the original fault. For example, if trouble shooting at the copy feed station and next, a document handling problem is flashed, (Example: A1 status code) the Service Representative would proceed next to the document handling trouble shooting charts.

An 80 chain or event code on the other hand, indicates that the sequence did not start. In combination with an E4 fault code, the Service Representative would be instructed to test the feed out switch if the status code occured during power up. The normal indication in checking the test feed out switch is that the copy light/dark indicators are on when the feed out switch is deactuated. Appropriate corrective action would be to check for an actuated feed out switch or a short in the feed out switch circuit. If E4/80 occured in the middle of a run, this would indicate a power problem and time trip circuitry which reset the controller.

In operation, as each event in the subsystem occurs, a real time event number will be monitored by the microprocessor 50 and available for display. In particular, the real time event number will be stored in scan register 51, document handler registers 52, or one of the paper path registers 53, 55, depending on which chain is appropriate.

When a fault is detected, the readout on display 77 will provide the last successfully completed event or the first unsuccessful event processed by the controller prior to the fault. The event number will be the key to the Service Representative in starting the trouble shooting. The diagnostic procedure incorporates the chain and event code with a jam status code. The jam status codes are the typical jam status codes used in the prior art. When a jam shutdown occurs, the quantity select display will flash the jam status code associated with the malfunction. The last successfully completed event will be available by pressing the "0" key on the control panel. Thus, the Service Representative with the use of the two codes can immediately focus on the malfunction or problem without having to go through a complex flow chart trouble shooting procedure.

Another feature of the use of the chain and event codes is to facilitate the testing of the various hardware components. For example, the first hardware component to operate in chain 8 is the paper feed clutch. To exercise or test the paper feed clutch, the Service Representative would then enter code 81, 8 for chain 8 and 1 for the first component or event in the chain 8 sequence. Then the Service Representative would press start print to energize the clutch and stop print to de-energize the clutch. The second event in chain 8 is the feed in switch. To exercise the feed in switch, the Service Representative would enter the code 82. Activating the switch would track the logic level at the printed wiring board, with the ground indicated by the copy lighter/darker LEDs off and high indicated by the copy lighter/darker LEDs on.

Another feature when in the hardware component exercising procedure is to be able to check critical intervals such as time intervals. For example, in chain 8, the time for the paper lead edge to actuate the feed-in switch 13 after print is critical. Entering a suitable code such as 8-51 will initiate a procedure to determine the time interval for the paper lead edge to actuate the feed-in switch 13 after print. This interval will be provided in a real time readout form (in seconds/milliseconds).

While there has been illustrated and described what is at present considered to be a preferred embodiment of the present invention, it will be appreciated that numerous changes and modifications are likely to occur to those skilled in the art, and it is intended in the appended claims to cover all those changes and modifications which fall within the true spirit and scope of the present invention.

We claim:

1. In a machine having a plurality of subsystems, each of the subsystems being divided into a plurality of processing events, the processing events being a sequence of operations related to specific hardware components in the subsystem for controlling machine operation, a controller, and a control panel for use in machine diagnostics, a method of diagnosing operation of the machine comprising the steps of:

continuously monitoring each completed processing event in each subsystem, recognizing a machine malfunction in any of the subsystems, identifying the particular subsystem manifesting the malfunction, responding to the machine malfunction and
indicating the completed processing events in the particular subsystem up to the point of malfunction in the subsystem in response to the machine malfunction.

2. The method of claim 1 wherein the control panel includes a display including the steps of displaying codes representing both machine malfunctions and completed processing events.

3. The method of claim 2 including the steps of first displaying a machine malfunction code and subsequently displaying a last completed event code.

4. The method of claim 3 including the step of displaying a last completed event code for each of the subsystems.

5. The method of claim 2 including the step of displaying a first unsuccessful event.

6. A printing machine having an operator console and a plurality of components such as an optics component, a document handling component, a photoreceptor component and a copy sheet handling component, each of the components comprising a plurality of processing events to be completed in cooperation with the other components in the operation of the machine, each of the processing events being a sequence of operations, a method of machine diagnostics including the steps of
monitoring the processing event of each machine component,
counting the processing events in each component upon completion,
storing an indication of each completed processing event in each component, and
manifesting each completed processing event whereby a record of completed processing events is maintained for machine diagnostics.

7. The method of claim 6 including the step of displaying an indication of the last completed processing event in each of the components upon detection of a machine malfunction.

8. The method of claim 6 including the step of displaying an indication of the first unsuccessively completed event in each of the components.

9. A reproduction machine having a controller including an operator panel, a photoreceptor, and a plurality of operation components cooperating with one another and the photoreceptor to produce reproductions, each of the processing components comprising a sequence of processing events to be completed in the operation of the machine, the controller coordinating the sequence of events to be completed in the operation of the machine and comprising
a plurality of counters, each of the counters associated with at least one operating component,
means to count the number of completed processing events in each operating component,
means to record the last completed processing event in a particular operating component,
means to detect machine malfunctions, and
means to display the last completed event in each of the components upon detection of a machine malfunction.

10. The apparatus of claim 7 wherein at least one of the counters is a register in the machine controller.

11. In a reproduction machine having a plurality of stations, each of the stations including a sequence of processing events to be completed during the operation of the machine, including events involving specific hardware components, a method of machine diagnostics including the steps of
detecting a machine malfunction,
halting machine operation upon detection of a machine malfunction,
recording an indication of the machine malfunction,
displaying the indication of the particular station causing the malfunction,
establishing a diagnostics mode, and
exercising the particular station indicating the malfunction by operating the station in the processing event sequence in order to determine the nature of the machine malfunction.

12. The method of claim 11 including the step of jumping to another station with a fault indication and sequentially diagnosing the events in said another station before exercising said particular station.

13. The method of claim 11 including the step of providing machine component related time tests.

14. The method of claim 3 including the step of displaying diagnostic timing information in real time seconds and milliseconds.

* * * * *